(12) United States Patent
Sorensen et al.

(10) Patent No.: US 9,923,272 B2
(45) Date of Patent: Mar. 20, 2018

(54) METHODS AND APPARATUS FOR CONTROLLING TUNABLE ANTENNA SYSTEMS

(71) Applicant: Apple Inc., Cupertino, CA (US)

(72) Inventors: Robert S. Sorensen, Fremont, CA (US); Qingxiang Li, Mountain View, CA (US); Matthew A. Mow, Los Altos, CA (US); Jinku Kim, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 172 days.

(21) Appl. No.: 14/719,223

(22) Filed: May 21, 2015

(65) Prior Publication Data

US 2015/0255869 A1    Sep. 10, 2015

Related U.S. Application Data

(63) Continuation of application No. 13/332,193, filed on Dec. 20, 2011, now Pat. No. 9,041,617.

(51) Int. Cl.
*H01Q 9/00* (2006.01)
*H01Q 5/314* (2015.01)
(Continued)

(52) U.S. Cl.
CPC ............. *H01Q 5/314* (2015.01); *H01Q 5/328* (2015.01); *H01Q 5/335* (2015.01); *H01Q 7/005* (2013.01);
(Continued)

(58) Field of Classification Search
CPC ............... H01Q 1/38; H01Q 1/50; H01Q 1/18
(Continued)

(56) References Cited

U.S. PATENT DOCUMENTS 4,381,566 A    4/1983  Kane
5,699,054 A    12/1997 Duckworth
(Continued)

FOREIGN PATENT DOCUMENTS

CN    1754313      3/2006
CN    202978926    6/2013
(Continued)

OTHER PUBLICATIONS

Parameswaran Sivalingam, et al. "Electronically Tunable Monopole Antenna Using Selective Capacitance Loading", Motorola, Inc., Apr. 15, 2008.

*Primary Examiner* — Dameon E Levi
*Assistant Examiner* — Collin Dawkins
(74) *Attorney, Agent, or Firm* — Treyz Law Group, P.C.; G. Victor Treyz; Michael H. Lyons

(57) ABSTRACT

An electronic device may include an adjustable power supply, at least one antenna, and associated antenna tuning circuitry. The antenna tuning circuitry may be an integral part of the antenna and may include a control circuit and at least one tunable element. The tunable element may include radio-frequency switches, continuously/semi-continuously adjustable components such as tunable resistors, inductors, and capacitors, and other load circuits that provide desired impedance characteristics. The power supply may provide power supply voltage signals to the antenna tuning circuitry via inductive coupling. The power supply voltage signals may be modulated according to a predetermined lookup table during device startup so that the control circuit is configured to generate desired control signals. These control signals adjust the tunable element so that the antenna can support wireless operation in desired frequency bands.

20 Claims, 16 Drawing Sheets

(51) Int. Cl.
*H01Q 7/00* (2006.01)
*H01Q 23/00* (2006.01)
*H03J 3/20* (2006.01)
*H01Q 5/328* (2015.01)
*H01Q 5/335* (2015.01)
*H04B 1/40* (2015.01)

(52) U.S. Cl.
CPC ............... *H01Q 23/00* (2013.01); *H03J 3/20* (2013.01); *H04B 1/40* (2013.01); *H03J 2200/11* (2013.01)

(58) Field of Classification Search
USPC .......................................... 343/745, 861, 850
See application file for complete search history.

(56) References Cited

U.S. PATENT DOCUMENTS

| | | |
|---|---|---|
| 6,907,234 B2 | 6/2005 | Karr et al. |
| 7,580,684 B2 | 8/2009 | Cyr et al. |
| 7,786,819 B2 | 8/2010 | Ella et al. |
| 2003/0119469 A1* | 6/2003 | Karr ....................... H01Q 1/273 455/307 |
| 2005/0184922 A1* | 8/2005 | Ida ........................ H04B 1/0458 343/861 |
| 2006/0050006 A1* | 3/2006 | Weit ......................... H01Q 3/32 343/876 |
| 2006/0176777 A1* | 8/2006 | Ihara ..................... G04R 20/10 368/47 |
| 2008/0305749 A1 | 12/2008 | Ben-Bassat |
| 2008/0305750 A1 | 12/2008 | Alon et al. |
| 2009/0073064 A1 | 3/2009 | Russo et al. |
| 2009/0128428 A1 | 5/2009 | Ishizuka et al. |
| 2010/0085260 A1 | 4/2010 | Hillan et al. |
| 2010/0302123 A1 | 12/2010 | Knudsen et al. |
| 2011/0260940 A1 | 10/2011 | Abe et al. |

FOREIGN PATENT DOCUMENTS

| | | |
|---|---|---|
| DE | 2456206 | 8/1976 |
| EP | 0021762 | 1/1981 |
| EP | 1630960 | 3/2006 |
| GB | 2463536 | 3/2010 |
| TW | 201025730 | 7/2010 |

* cited by examiner

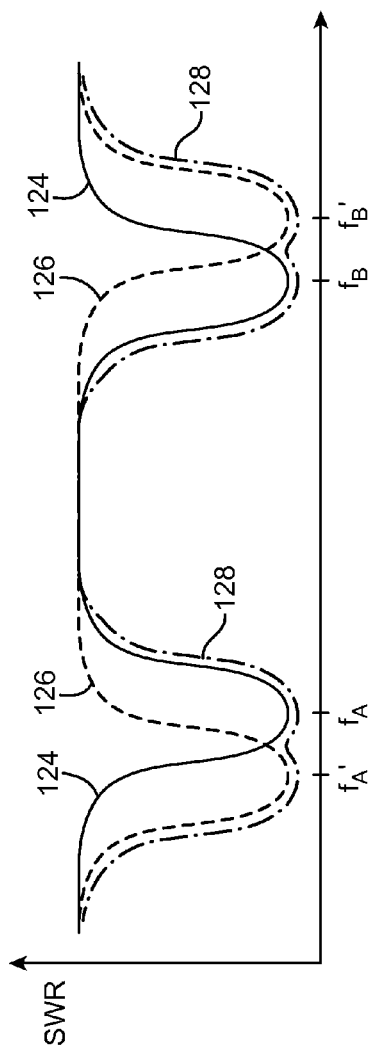
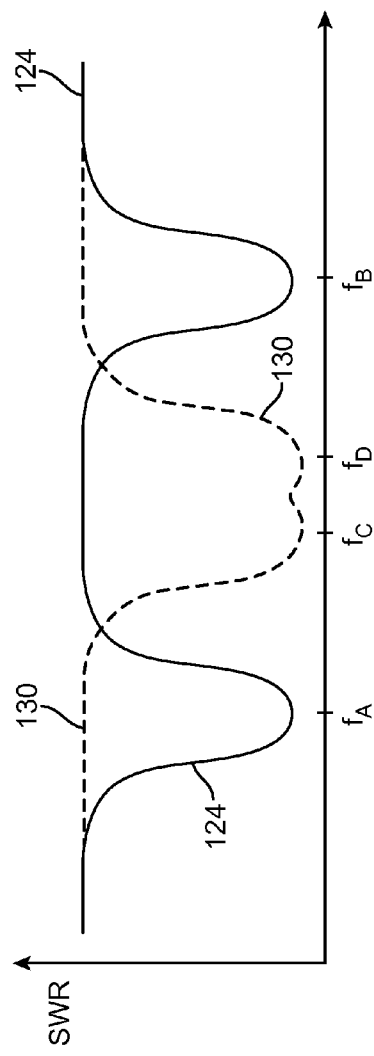

METHODS AND APPARATUS FOR CONTROLLING TUNABLE ANTENNA SYSTEMS

This application is a continuation of U.S. patent application Ser. No. 13/332,193, filed Dec. 20, 2011, which is hereby incorporated by reference herein in its entirety. This application claims the benefit of and claims priority to U.S. patent application Ser. No. 13/332,193, filed, Dec. 20, 2011.

BACKGROUND

This relates generally to wireless communications circuitry, and more particularly, to electronic devices that have wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too small, the antenna will not be able to cover all communications bands of interest.

In view of these considerations, it would be desirable to provide improved wireless circuitry for electronic devices.

SUMMARY

A wireless electronic device may include storage and processing circuitry and wireless communications circuitry. The wireless communications circuitry may include a baseband processor, transceiver circuitry, and at least one antenna. The transceiver circuitry may be coupled to the antenna via a transmission line having a signal path and a ground path. The signal path may be coupled to a positive antenna feed terminal while the ground path may be coupled to a ground antenna feed terminal.

The antenna may include an antenna resonating element and at least one antenna tuning circuit. The antenna resonating element may be coupled to the signal path via a capacitor, whereas the antenna tuning circuit may be coupled to the signal path via an inductor. The storage and processing circuitry may couple a device power supply voltage onto the signal and ground paths via inductive circuits. Configured in this way, radio-frequency signals may be conveyed between the transceiver circuitry and the antenna resonating element while the device power supply voltage signal may be passed to the antenna tuning circuit.

The antenna tuning circuit may include a control circuit and a tunable element. The antenna tuning circuit may include a voltage regulator, a comparator, a low-pass filter, and a counter. The voltage regulator may be capable of generating a first fixed voltage signal that is lower in magnitude compared to the device power supply voltage signal, a second voltage signal that is a scale-down version of the device power supply voltage signal, and a third reference voltage signal that is lower in magnitude compared to the first voltage signal. The second and third voltage signals may be fed to first and second inputs of the comparator, respectively. The comparator may be configured to drive its output high when the second voltage signal exceeds the third voltage signal and may be configured to drive its output low when the third voltage signal exceeds the second voltage signal.

The output of the comparator may be coupled to a control input of the counter. The counter may count up in response to detecting a rising transition at its control input (as an example). The counter may also have a reset input operable to receive a low-pass filtered version of the first voltage signal (e.g., the reset input of the counter may receive the first voltage signal via the low-pass filter). The counter may generate a control signal reflective of its current count value. The control signal may be used directly in adjusting tunable element. The tunable element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the antenna at selected frequencies.

The control circuit may be configured by modulating the power supply voltage signal according to a predetermined scheme during startup (e.g., during power-on-reset operations). For example, the power supply voltage signal may be toggled a given number of times between first and second positive voltage levels to trigger counter to count up to a desired number. The number of time the counter increments may be determined based on the desired operating frequency band of the wireless device. For example, the counter may be configured to exhibit a count of four so that antenna can support wireless operation in a first set of frequency bands or may be configured to exhibit a count of six so that antenna can support wireless operation in a second set of frequency bands that is different than the first set of frequency bands. The required count number corresponding to the different frequency bands may be tabulated in a precomputed list that is stored in the storage and processing circuitry of the device. By using an antenna tuning scheme of this type, the antenna may be able to cover a wider range of communications frequencies than would otherwise be possible.

Further features of the present invention, its nature and various advantages will be more apparent from the accompanying drawings and the following detailed description.

BRIEF DESCRIPTION OF THE DRAWINGS

FIGS. 9 and 10 are plots showing how antennas containing tuning circuitry may be used to cover multiple communications bands of interest in accordance with an embodiment of the present invention.

DETAILED DESCRIPTION

Figure 1:
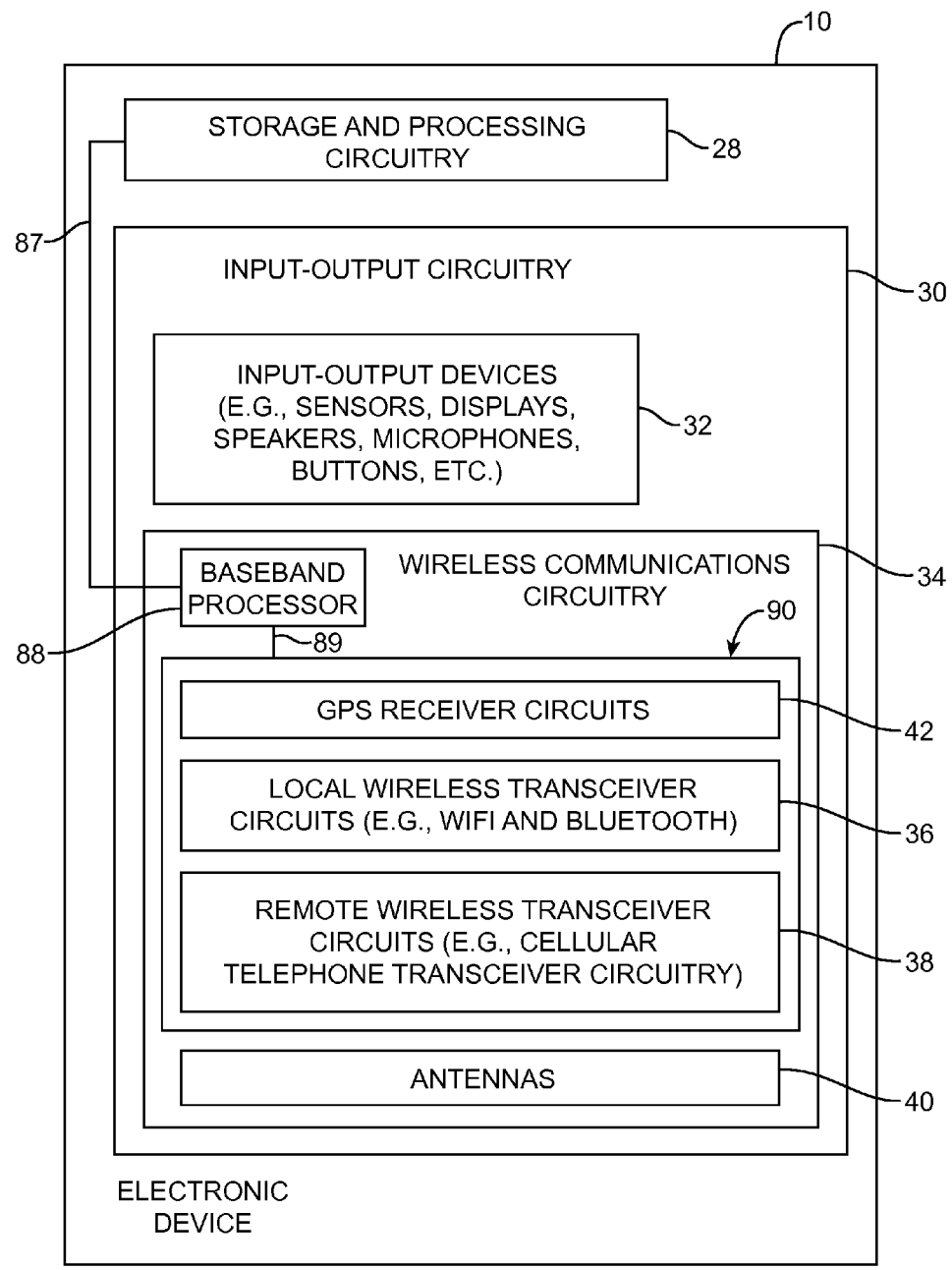
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range wireless links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may provide data to storage and processing circuitry 28 via path 87. The data on path 87 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands on path 89 that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
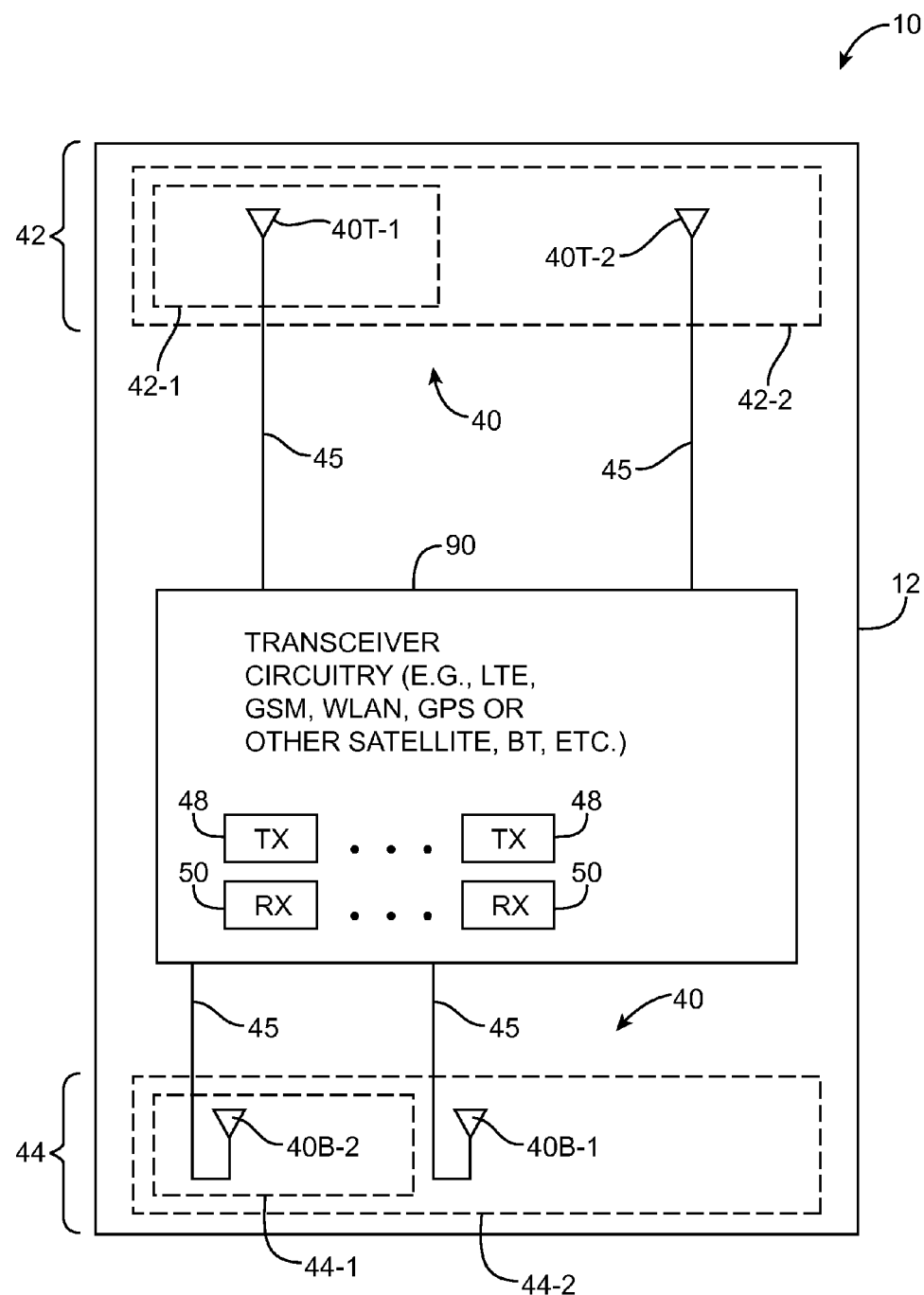
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
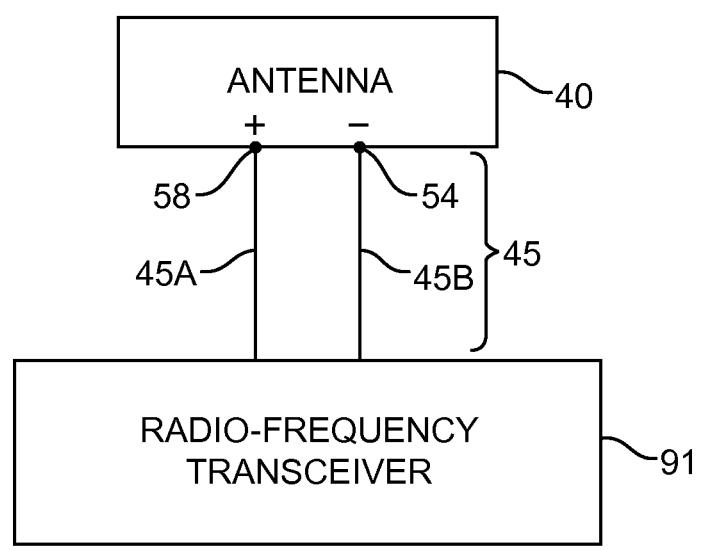
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may be a receiver and/or transmitter in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

Antenna 40 of FIG. 3 may be capable of supporting wireless communications in a first set of radio-frequency bands. For example, antenna 40 may be operable in a lower frequency band that covers the GSM sub-bands at 850 MHz and 900 MHz and a higher frequency band that covers the GSM sub-bands at 1800 MHz and 1900 MHz and the data sub-band at 2100 MHz.

It may be desirable for device 10 to be able to support other wireless communications bands in addition to the first set of radio-frequency bands. For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). In general, for an antenna having a given volume, a higher band coverage (or bandwidth) results in a decrease in gain (e.g., the product of maximum gain and bandwidth is constant).

Figure 4:
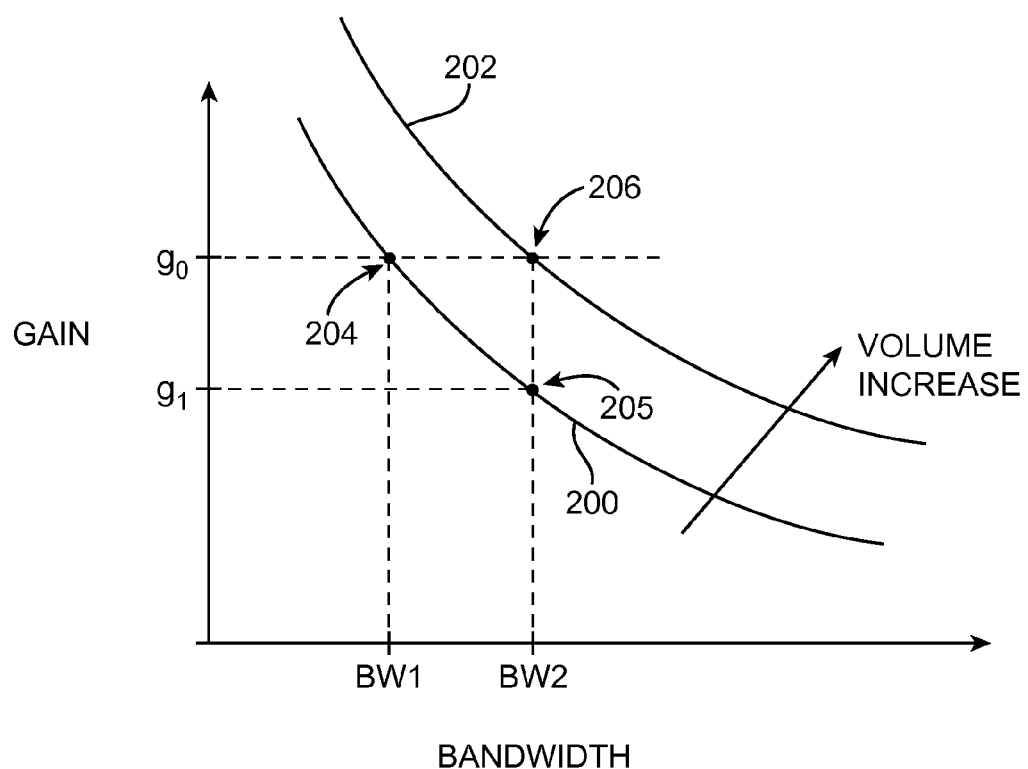
FIG. 4 is plot showing trade-offs between antenna gain and antenna bandwidth for a given antenna volume.

FIG. 4 is a graph showing how antenna gain varies as a function of antenna bandwidth for a loop antenna (as an example). Curve 200 represents a gain-bandwidth characteristic for a first loop antenna having a first volume, whereas curve 202 represents a gain-bandwidth characteristic for a second loop antenna having a second volume that is greater than the first volume. As shown in FIG. 4, the first loop antenna can provide bandwidth BW1 while exhibiting gain $g_0$ (point 204). In order to provide more bandwidth (i.e., bandwidth BW2) with the first loop antenna, the gain of the first loop antenna would be lowered to gain $g_1$ (point 205).

One way of providing more band coverage is to increase the volume of the loop antenna. For example, the second loop antenna having a greater volume than the volume of the first loop antenna is capable of providing bandwidth BW2 while exhibiting $g_0$ (point 206). Increasing the volume of loop antennas, however, may not always be feasible if a small form factor is desired.

To satisfy consumer demand for small form factor wireless devices, one or more of antennas 40 may be provided with antenna tuning circuitry. The tuning circuitry may include, for example, switching circuitry based on one or more switches or continuously tunable load components. The switching circuitry may, for example, include a switch that can be placed in an open or closed position. When the switch is placed in its open position, an antenna may exhibit a first frequency response. When the switch is placed in its closed position, the antenna may exhibit a second frequency response. By using an antenna tuning scheme of this type, antennas 40 may be able to cover a wider range of communications frequencies than would otherwise be possible. The use of tuning for antennas 40 may allow a relatively narrow bandwidth (and potentially compact) design to be used, if desired.

The way in which antenna 40 operates may be understood with reference to FIGS. 5-18, which show how antenna 40 of FIG. 3 may be implemented by adding antenna tuning circuitry antenna 40.

Figure 5:
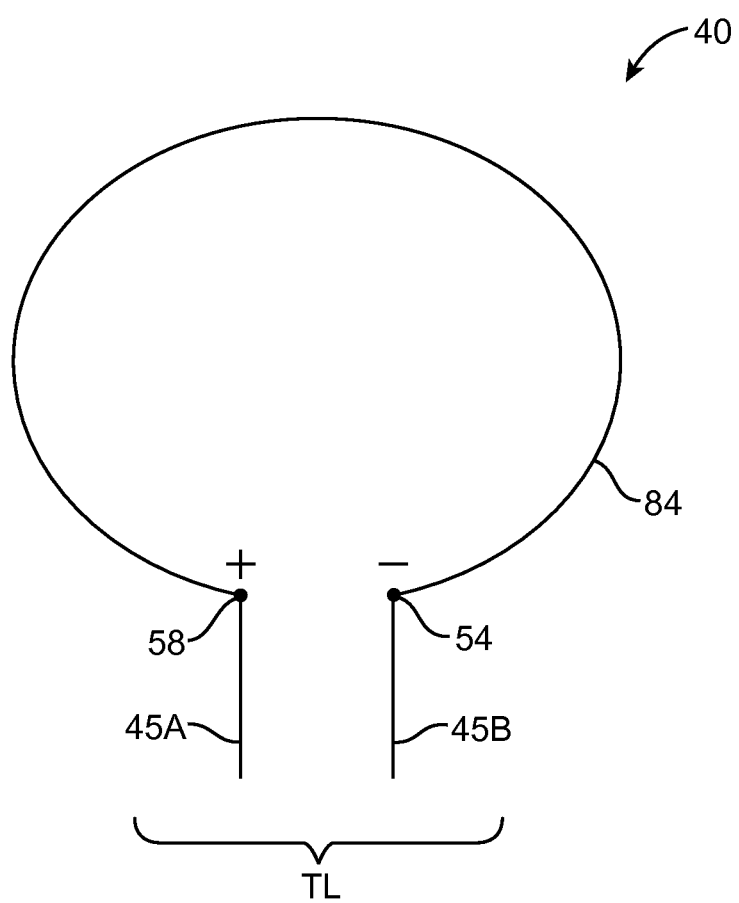
FIG. 5 is a schematic diagram of an illustrative series-fed loop antenna that may be used in an electronic device in accordance with an embodiment of the present invention.

In one suitable embodiment of the present invention, antenna 40 may be a loop antenna. FIG. 5 is a schematic diagram of a series-fed loop antenna that may be used in device 10. As shown in FIG. 5, series-fed loop antenna 40 may have a loop-shaped conductive path such as loop 84. Transmission line TL may include positive signal conductor 45A and ground conductor 45B. Paths 45A and 45B may be contained in coaxial cables, micro-strip transmission lines on flex circuits and/or rigid printed circuit boards, etc. Transmission line TL may be coupled to the feed of antenna 40 using positive antenna feed terminal 58 and ground antenna feed terminal 54.

It may be challenging to use a series-fed feed arrangement of the type shown in FIG. 5 to feed a multi-band loop antenna. For example, it may be desired to operate a loop antenna in a lower frequency band that covers the GSM sub-bands at 850 MHz and 900 MHz and a higher frequency band that covers the GSM sub-bands at 1800 MH and 1900 MHz and the data sub-band at 2100 MHz. This type of arrangement may be considered to be a dual band arrangement (e.g., 850/900 for the first band and 1800/1900/2100 for the second band) or may be considered to have five bands (850, 900, 1800, 1900, and 2100). In multi-band arrangements such as these, series-fed antennas such as loop antenna 82 of FIG. 5 may exhibit substantially better impedance matching in the high-frequency communications band than in the low-frequency communications band.

Figure 6:
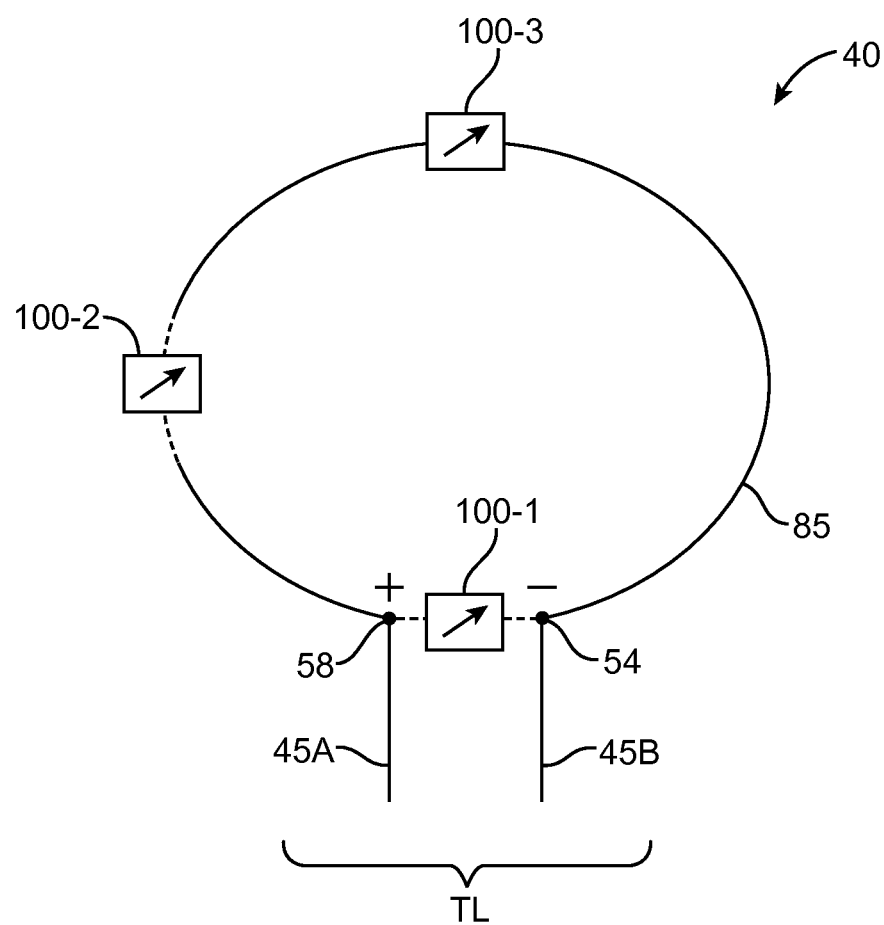
FIG. 6 is a schematic diagram of an illustrative parallel-fed loop antenna containing antenna tuning circuitry in accordance with an embodiment of the present invention.

A more satisfactory level of performance may be obtained using a parallel-fed arrangement with appropriate impedance matching features. An illustrative parallel-fed loop antenna is shown schematically in FIG. 6. As shown in FIG. 6, parallel-fed loop antenna 40 may have a loop of conductor such as loop 85. Loop 85 in the FIG. 6 example is shown as being circular. This is merely illustrative. Loop 85 may have other shapes if desired (e.g., rectangular shapes, shapes with both curved and straight sides, shapes with irregular borders, etc.).

An antenna tuning circuit such as tuning circuit 100-1 may bridge terminals 58 and 54, thereby "closing" the loop formed by path 85. In such an arrangement, a capacitive circuit may be interposed in loop 85 so that antenna feed terminals 58 and 54 are not shorted together at low frequencies. If desired, additional antenna tuning circuits such as antenna tuning circuits 100-2 and 100-3 may be interposed in loop 85 in the parallel-fed loop antenna of FIG. 6. For example, tuning circuit 100-1 may be a switchable impedance matching circuit, whereas circuit 100-2 may be a continuously adjustable variable capacitor. The impedance of parallel-fed loop antenna 40 of FIG. 6 may be adjusted by proper tuning/selection of circuits 100 (e.g., antenna tuning circuits 100-1, 100-2, and 100-3). In general, antenna 40 may include any number of antenna tuning circuits 100 to provide desired flexibility/tunability.

Figure 7A:
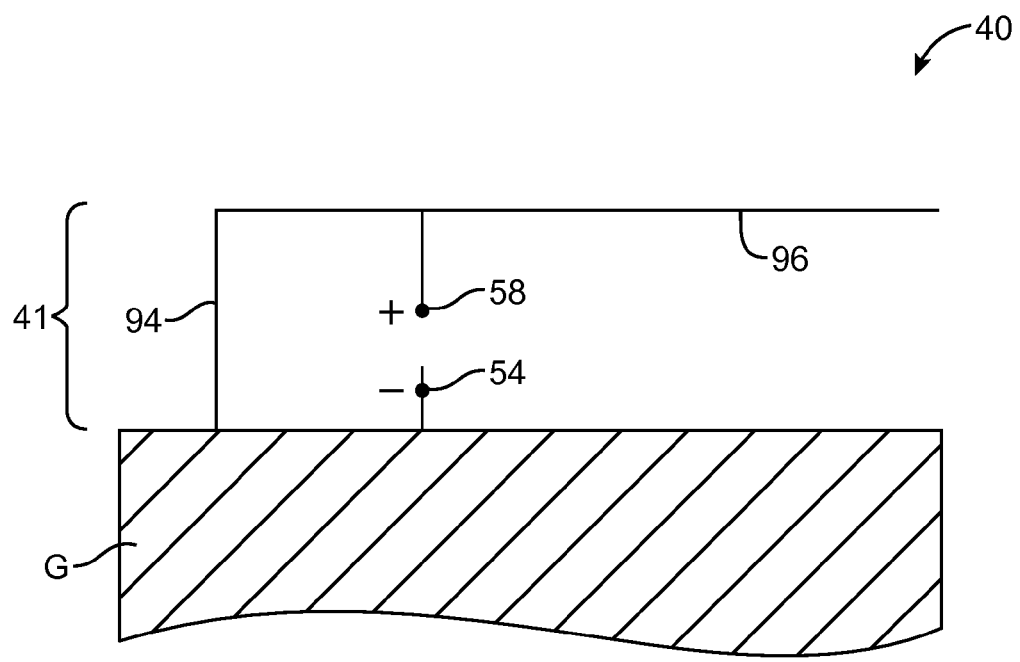
FIG. 7A is a schematic diagram of an illustrative inverted-F antenna that may be used in an electronic device in accordance with an embodiment of the present invention.

In another suitable embodiment of the present invention, antenna 40 may be an inverted-F antenna. FIG. 7A is a schematic diagram of an inverted-F antenna that may be used in device 10. As shown in FIG. 7A, inverted-F antenna 40 may have an antenna resonating element such as antenna resonating element 41 and a ground structure such as ground G. Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 7A example is shown as being a single straight segment. This is merely illustrative. Arm 96 may have multiple bends with curved and/or straight segments, if desired.

Figure 7B:
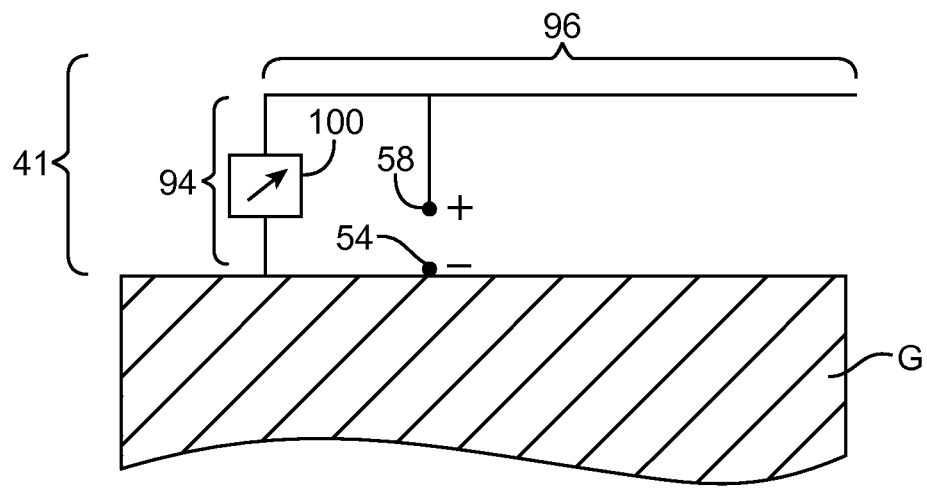
FIGS. 7B and 7C are schematic diagrams of an illustrative inverted-F antenna containing an antenna tuning circuit in accordance with an embodiment of the present invention.
Figure 7C:
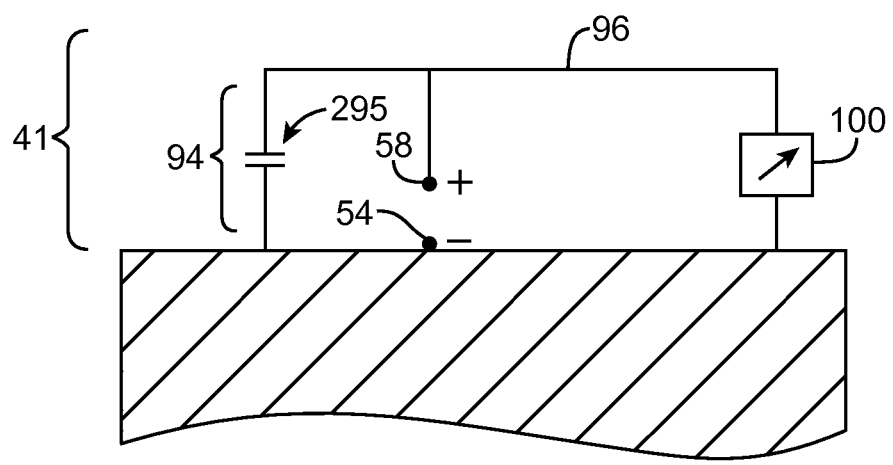

In one suitable arrangement of the present invention, resonating element 41 of inverted-F antenna 40 may include an antenna tuning circuit 100 interposed in shorting path 94 (see, e.g., FIG. 7B). In the example of FIG. 7B, antenna tuning circuit 100 may be a switchable impedance matching network, a switchable inductive network, a continuously tunable capacitive circuit, etc. In yet another suitable arrangement of the present invention, resonating element 41 of inverted-F antenna 40 may include an antenna tuning circuit 100 coupled between the extended portion of resonating arm 96 and ground G (see, e.g., FIG. 7C). In such an arrangement, a capacitive structure such as capacitor 295 may be interposed in shorting path 94 so that antenna tuning circuit 100 is not shorted to ground at low frequencies. In the example of FIG. 7C, antenna tuning circuit may be a switchable inductor, a continuously tunable capacitive/resistive circuit, etc.

Figure 8:
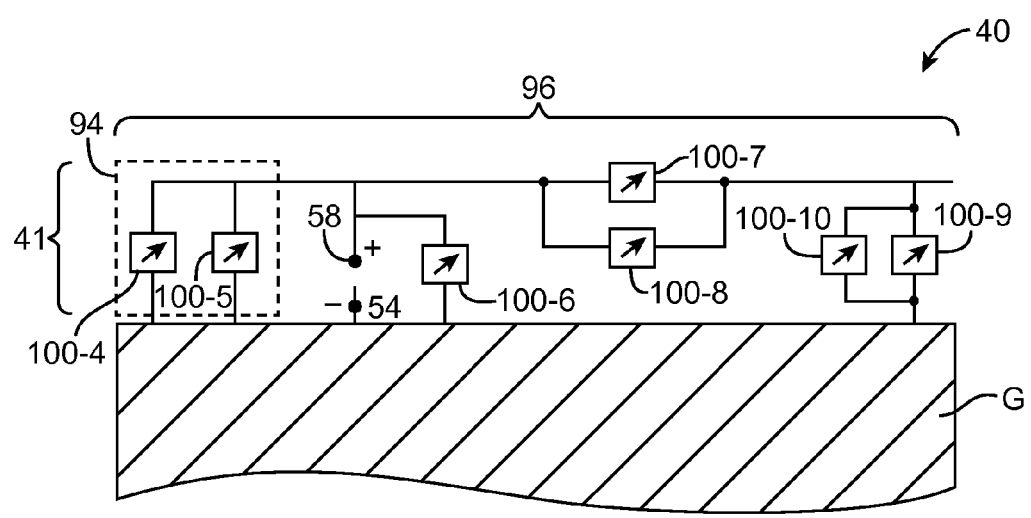
FIG. 8 is a schematic diagram of an illustrative inverted-F antenna containing antenna tuning circuitry in accordance with an embodiment of the present invention.

In general, inverted-F antenna 40 may include any number of antenna tuning circuits 100. As shown in FIG. 8, short circuit branch 94 may include at least one tuning circuit that couples arm 96 to ground. For example, tuning circuits 100-4 and 100-5 may be interposed in short circuit path 94.

Tuning circuits 100-4 and 100-5 may be switchable inductive paths, as an example (e.g., at least one of tuning circuits 100-4 and 100-5 may be activated to short arm 96 to ground). If desired, antenna tuning circuit 100-6 may be coupled in parallel with the antenna feed between positive antenna feed terminal 58 and ground feed terminal 54. Tuning circuit 100-6 may be an adjustable impedance matching network circuit, as an example.

As another example, antenna tuning circuit 100-7 may be interposed in the antenna resonating arm 96. An additional tuning circuit such as tuning circuit 100-8 may also be coupled in parallel with antenna tuning circuit 100-7. Antenna tuning circuit 100-7 may be a continuously adjustable variable capacitor, whereas circuit 100-8 may be a switchable inductor (as examples). If desired, additional tuning circuits such as antenna tuning circuits 100-9 and 100-10 (e.g., continuously tunable or semi-continuously tunable capacitors, switchable inductors, etc.) may be coupled between the extended portion of arm 96 to ground G.

The placement of these tuning circuits 100 in FIGS. 7 and 8 is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning circuit 100 (formed at any suitable location on the antenna) that can be adjusted so that wireless circuitry 34 may be able to cover the desired range of communications frequencies.

By dynamically controlling antenna tuning circuits 100, antenna 40 may be able to cover a wider range of communications frequencies than would otherwise be possible. A standing-wave-ratio (SWR) versus frequency plot such as SWR plot of FIG. 9 illustrates the band tuning capability for antenna 40. As shown in FIG. 9, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning circuits 100 of antenna 40 may be placed in a first configuration (e.g., antenna tuning circuits 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning circuits 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning circuits 100 may be placed in a third configuration that is different than the first and second configurations (e.g., antenna tuning circuits 100 may be provided with a third set of control signals that is different than the first and second sets of control signals). A combination of tuning methods may be used so that the resonance curve 128 exhibits broader frequency ranges than curves 124 and 126.

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 10. In the fourth antenna tuning mode, the antenna tuning circuits 100 may yet be placed in another different configuration. The SWR curves of FIGS. 9 and 10 are merely illustrative and do not serve to limit the scope of the present invention. In general, antenna(s) 40 may include antenna tuning circuits 100 that enable device 10 to transmit and receive wireless signals in any suitable number of radio-frequency communications bands.

Antenna tuning circuits 100 may be formed as an integral part of antenna 40. In such arrangements, there needs to be a way for storage and processing circuitry 28 to adjust each tuning circuit 100 prior to normal wireless operation. Because tuning circuits 100 can include active circuits such as radio-frequency switches, tuning circuits 100 may also need to be provided with power supply voltages. As described previously in connection with FIG. 3, antenna 40 may be coupled to radio-frequency transceiver 91 via signal path 45A and ground path 45B. Storage and processing circuit 28 (sometimes referred to herein as control circuitry) may couple direct current (DC) voltage signal V1 onto path 45 via inductors 293 (see, e.g., FIG. 11). Signal V1 may be varied in time using storage and processing circuitry 28 and/or baseband processor 88 and may therefore sometimes be referred to as a control signal.

Signal path 45A may be coupled to antenna resonating element 41 of antenna 40 via capacitive circuit 294 and may be coupled to antenna tuning circuit 100 via an inductive circuit 296. Capacitor 294 serves to pass only radio-frequency signals (sometimes referred to as alternating current "small" signals) to antenna resonating element 41, whereas inductor 296 serves to pass only low-frequency signals (sometimes referred to as DC "large" signals) to antenna tuning circuit 100 (e.g., capacitor 294 serves as an AC coupler while inductor 296 serves as a DC coupler). Power supply voltage signal V1 may be passed to tuning circuit 100 via DC coupling path 297.

In one suitable embodiment of the present invention, power supply voltage signal V1 that is passed to antenna tuning circuit 100 may be modulated (toggled) using a predetermined pattern for placing antenna tuning circuit 100 in the desired state. Power supply voltage signal V1 may be used to configure antenna tuning circuit 100 during device startup (e.g., during power-on-reset procedures) and may be used for powering switches and other active components in circuit 100 during normal operation. More than one antenna tuning circuit 100 may be coupled to signal path 45A and ground path 45B in this way. Controlling and powering antenna tuning circuits 100 via the existing signal path 45A allows for a simple implementation that does not require additional power supply lines and control lines to be formed between antenna 40 and transceiver 91.

An antenna tuning circuit 100 may include a control circuit such as control circuit 300 and a tunable element such as tunable element 302. Control circuit 300 may provide a control signal Vc that is used for controlling tunable element 302. In general, tunable element 302 may be formed from one or more adjustable electrical components. Components that may be used as all or part of circuit 302 include tunable resistive circuits, continuously/semi-continuously adjustable inductive circuits, continuously/semi-continuously adjustable capacitive circuits, radio-frequency switches, and other loading circuits suitable for provide desired impedance characteristics. Desired resistances, inductances, and capacitances for circuit 302 may be formed using integrated circuits, using discrete components (i.e., surface mount technology components) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path on a printed circuit board.

Figure 11:
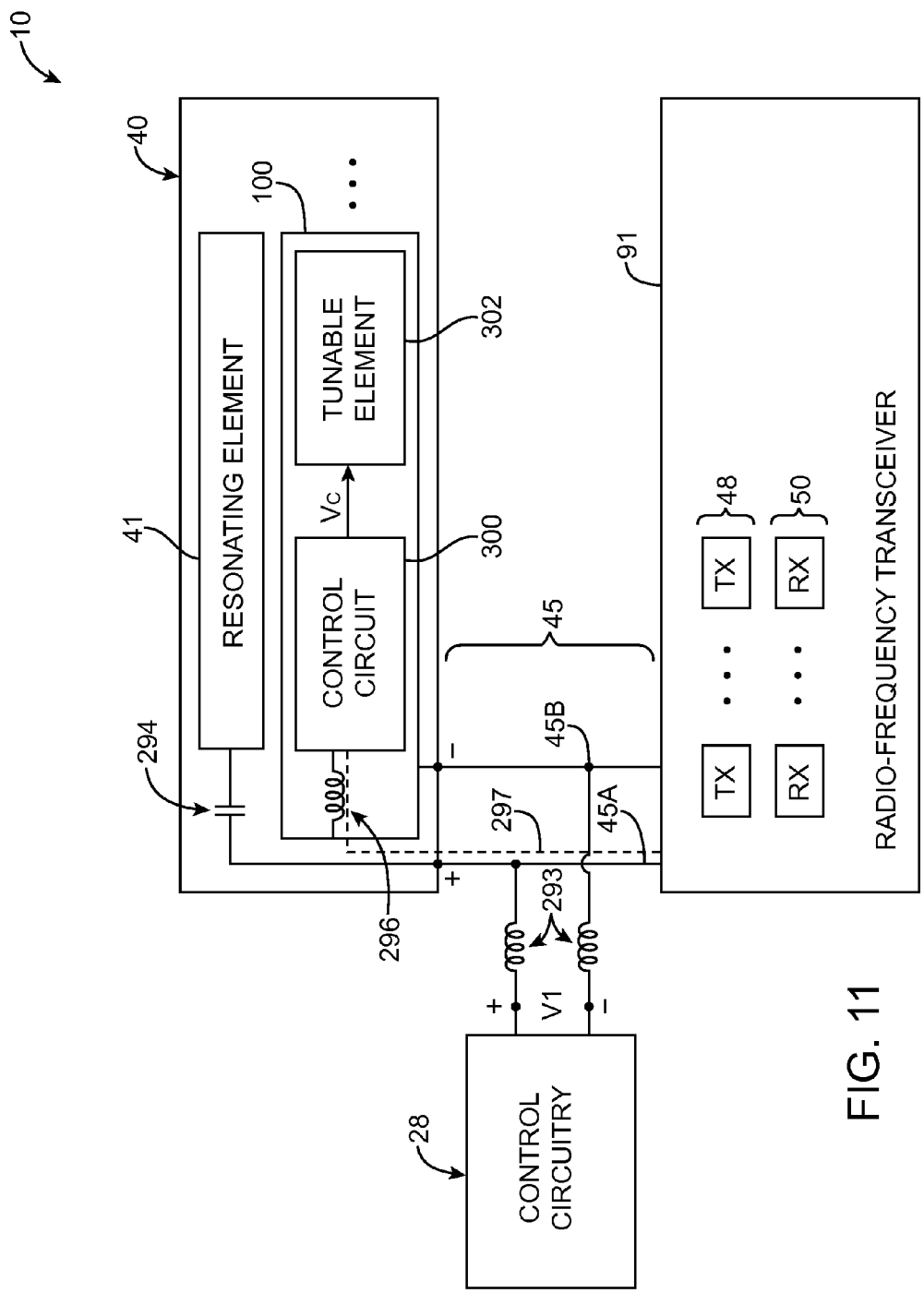
FIG. 11 is a diagram showing how an antenna containing antenna tuning circuitry may be coupled to radio-frequency transceiver circuitry in accordance with an embodiment of the present invention.
Figure 12:
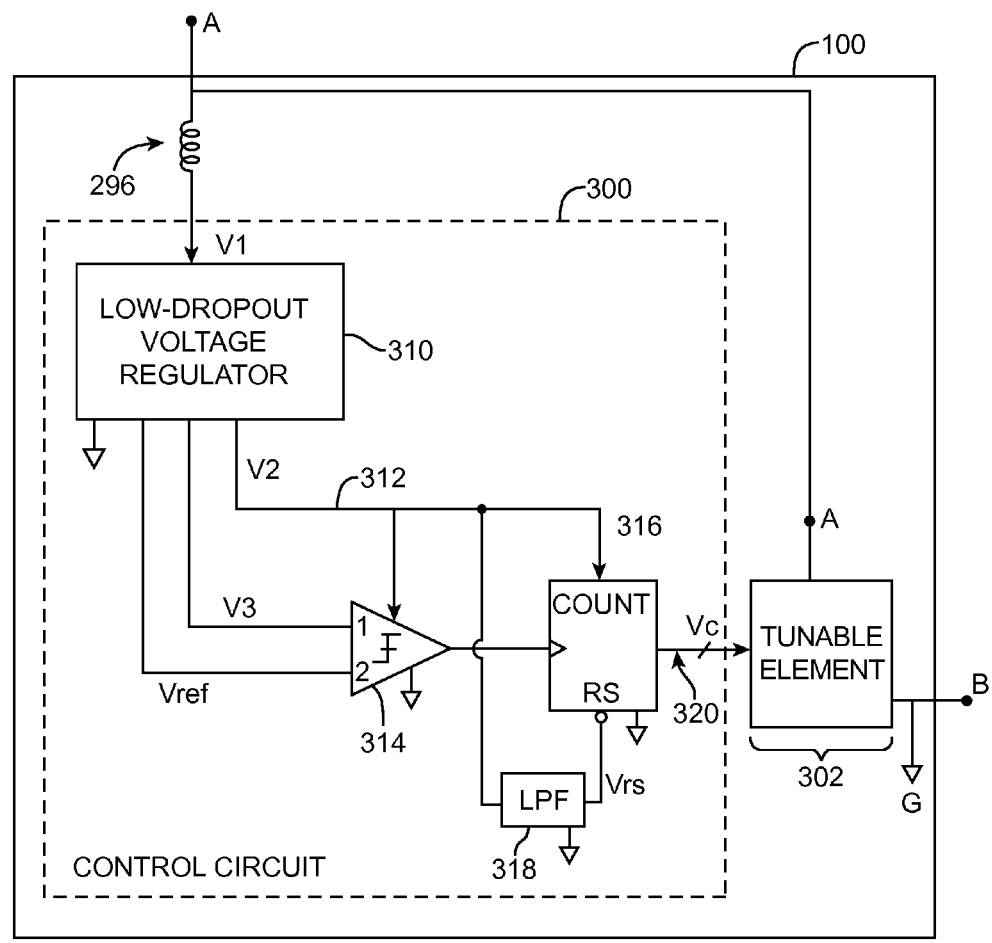
FIG. 12 is a circuit diagram of illustrative antenna tuning circuitry that includes a control circuit and a tunable element in accordance with an embodiment of the present invention.

FIG. 12 is a diagram showing one suitable circuit implementation of antenna tuning circuit 100. Antenna tuning circuit 100 may be a two terminal circuit having a first terminal A that may be coupled to arm 96 and a second terminal B that may be coupled to ground G. Voltage signal V1 may be applied across terminals A and B. As shown in FIG. 12, control circuit 300 may include at least a low-dropout voltage regulator 310, a comparator 314, a counter 316, and a low-pass filter 318. Voltage regulator 310 may receive voltage signal V1 generated from circuitry 28 via inductive DC coupler 296 (FIG. 11). Voltage regulator 310 may be operable to generate voltage signal V2 having a constant voltage level that is lower than the nominal positive power supply voltage level of V1, voltage signal V3 that is a scaled-down version of voltage signal V1 (e.g., signal V3 will behave similarly to signal V1 but at relatively lower voltage magnitudes), and a reference voltage signal Vref. Signal V2 may be used to power comparator 314 and counter 316 (e.g., power supply voltage signal V2 may be supplied to these respective circuits over path 312). Circuits 310, 314, 316, and 318 may all be coupled to terminal B so that they each have ground path. If desired, other types of voltage regulators may be used for generating voltage signals V2, V3, and Vref.

Comparator 314 may have a first input that is configured to receive signal V3, a second input that is configured to receive signal Vref, and an output. Comparator 314 may drive its output high when the voltage level at its first input is greater than the voltage level at its second input (e.g., comparator 314 may generate a high output signal when V3 exceeds Vref) and may drive its output low when the voltage level at its second input is greater than the voltage level at its first input (e.g., comparator 314 may generate a low output signal when V3 falls below Vref).

Counter 316 may have a control input that receives the output signal from comparator 314. Counter 316 may, as an example, be an edge-triggered counting circuit such as a positive-edge-triggered counting circuit. In this example, counter 316 will count up in response to detecting a rising edge at its control input (e.g., counter 316 may be used to monitor/count the number of pulses present in signal V1). Counter 316 may also include a reset input for receiving reset signal Vrs. Signal Vrs may be a filtered version of signal V2 (e.g., low-pass filter 318 may be used to filter signal V2).

For example, consider a scenario in which device 10 is initially being powered up. During power-on-reset (POR) operations, signal V2 may initially be equal to zero volts and may be driven to a high voltage level using voltage regulator 310 (e.g., signal V2 may be stepped up from zero volts to a positive voltage level). When signal V2 is low, Vrs is low and counter 316 may be placed in reset mode having a count value of zero. When signal V2 is driven high, Vrs will gradually be charged high and when Vrs is high, counter 315 is no longer stuck in reset mode and can now begin counting up upon detecting rising and/or falling edges at its control input.

Counter 316 may provide a count signal Vc reflective of its current count value. Signal Vc may be a multi-bit digital signal or a continuous analog signal. Tunable element 302 may be configured to receive signal Vc via path 320. Tunable element 302 may be a three terminal component having a first terminal that is shorted to terminal A of antenna tuning element 100, a second terminal that serves as terminal B for antenna tuning element 100 (e.g., a second terminal B that is grounded), and a third terminal at which control signal Vc is received. Tunable element 302 may be placed in a desired operating state based on the value of signal Vc. Control circuit 300 arranged in this way may therefore serve as control logic that can be configured during startup to provide a desired Vc value for adjusting tunable element 302. A single antenna 40 may include multiple antenna tuning circuits 100, where each of these tuning circuits may be properly adjusted so that wireless circuitry 34 may provide coverage in desired frequency bands.

Figure 13:
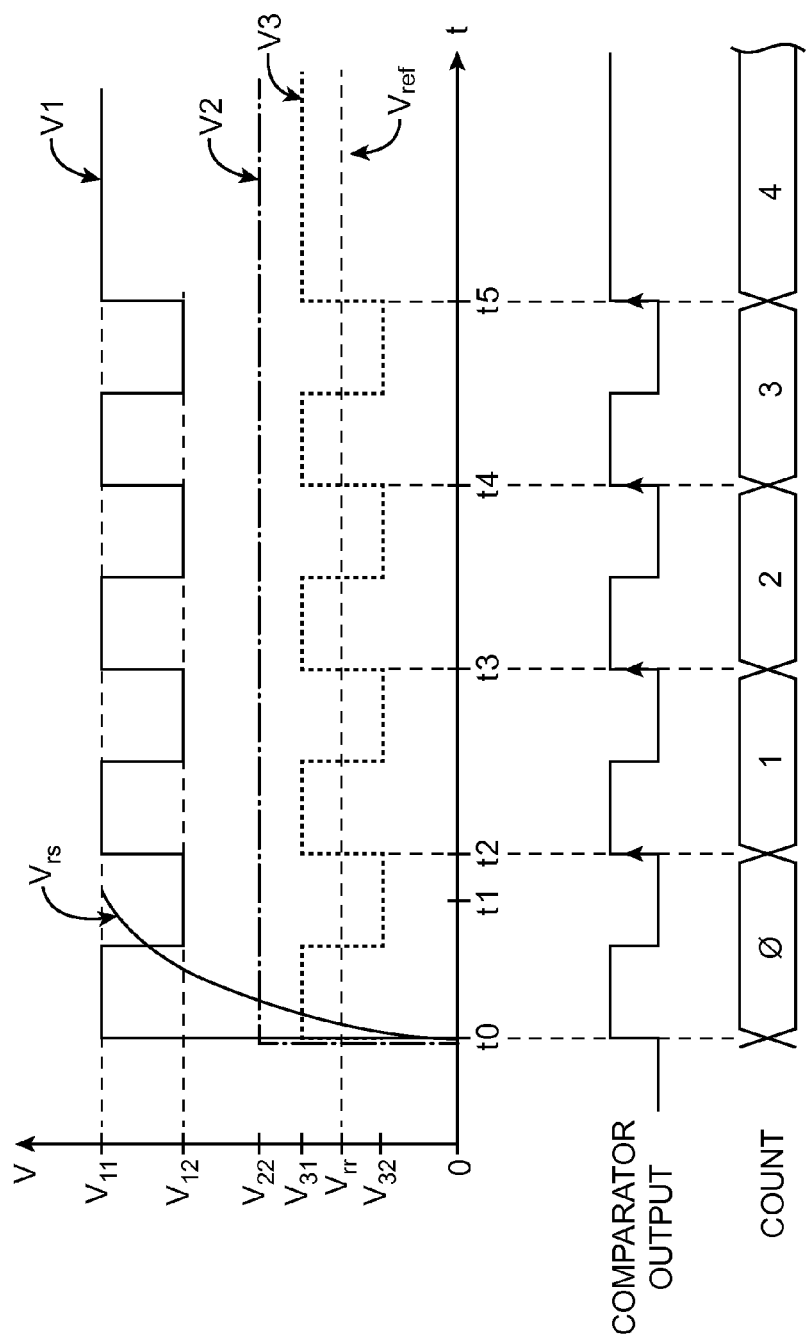
FIG. 13 is a timing diagram illustrating the operation of the antenna tuning circuitry of the type shown in FIG. 12 in accordance with an embodiment of the present invention.

The operation of antenna tuning circuit 100 is further illustrated by the timing diagram of FIG. 13. At time t0, device 10 may be powered up and voltage signals V1, V2, V3, and Vref may be driven high to respective positive voltage levels (e.g., signal V1 may be asserted to voltage level $V_{11}$, signal V2 may be asserted to voltage level $V_{22}$, signal V3 may be asserted to voltage level $V_{31}$, and signal Vref may be asserted to voltage level $V_{rr}$). As shown in FIG. 13, signals V1 and V3 may be modulated according to some predetermined pattern, whereas signals V2 and Vref are fixed. For example, signal V1 may have a voltage level that varies between $V_{11}$ and $V_{12}$ while signal V3 may have a voltage level that varies between $V_{31}$ and $V_{32}$. In the example of FIG. 13, voltage level $V_{12}$ is greater than $V_{22}$, and voltage level $V_{22}$ is greater than $V_{31}$. Voltage level $V_{22}$ should be less than $V_{31}$ but greater than $V_{32}$ so that comparator 314 will toggle its output in response to changes in signal V3. For example, comparator 314 will drive its output high when signal V3 is at voltage level $V_{31}$ (i.e., when V3 is greater than Vref) and will drive its output low when V3 is at voltage level $V_{32}$ (i.e., when V3 is less than Vref).

Counter 316 may keep track of a current count value whenever a rising edge is detected at its control input (FIG. 12). The count value will remain at zero until low-pass filtered voltage signal Vrs rises high (at time t1). When Vrs is high, counter 316 can begin incrementing its count value. In general, a rising edge will be generated at the comparator output whenever signal V1 toggles from voltage level $V_{12}$ back to $V_{11}$ (or whenever signal V3 rises from voltage level $V_{32}$ back to $V_{31}$ since V3 is proportional to V1). As shown in the example of FIG. 13, counter 316 may count up at time t2, t3, t4, and t5 so that the final count value is equal to four. If desired, signal V1 can be modulated using any desired signal modulation scheme (e.g., using a square-wave pattern as shown in FIG. 13, a sinusoidal waveform, a sawtooth waveform, or other types of waveforms) so that counter 316 exhibits the desired count value prior to normal operation. The resulting control signal Vc (which is proportional to the final count value) may be used directly in controlling tunable element 302.

Figure 14:
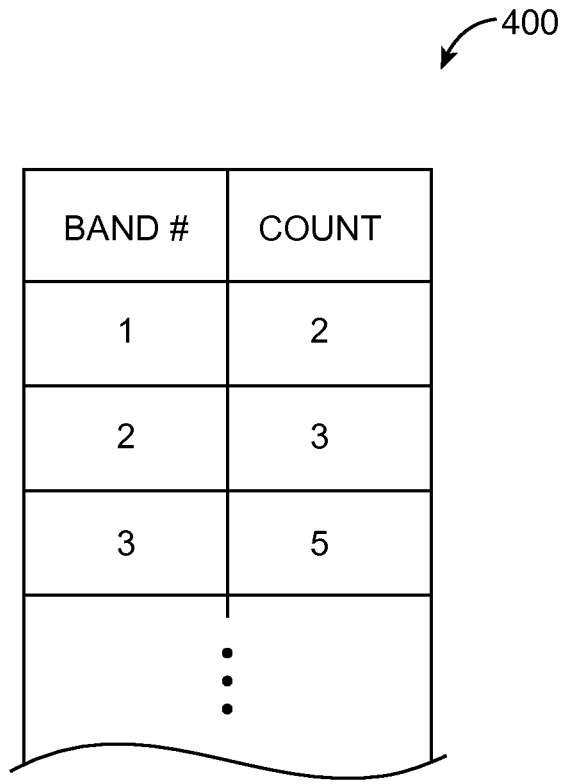
FIG. 14 is an illustrative lookup table containing predetermined control information corresponding to different operating frequencies in accordance with an embodiment of the present invention.

FIG. 14 is an illustrative lookup table 400 showing required count values corresponding to each operating frequency band. Table 400 may contain precharacterized control values and may be stored in storage and processing circuitry 28. As shown in FIG. 14, a count value of two is required for operation in frequency band 1, a count value of three is required for operation in frequency band 2, a count value of five is required for operation in frequency band 5, etc. Antenna tuning circuits 100 may be adjusted in parallel during device startup based on the values of table 400. As a result, each tuning circuit 100 should be designed such that a given count value in look-up table 400 serves to help antenna 40 exhibit satisfactory wireless performance in the corresponding frequency band(s).

In other suitable arrangements, each antenna tuning circuit 100 may be adjusted individually. This implementation may require additional control circuitry and control paths that allow control signals to be routed individually to each antenna tuning circuit 100 during startup or during normal operation. In such arrangements, each antenna tuning circuit 100 may have a dedicated lookup table 400 indicating the required control value for controlling its tunable element 302 so that the desired frequency band is covered.

Figure 15:
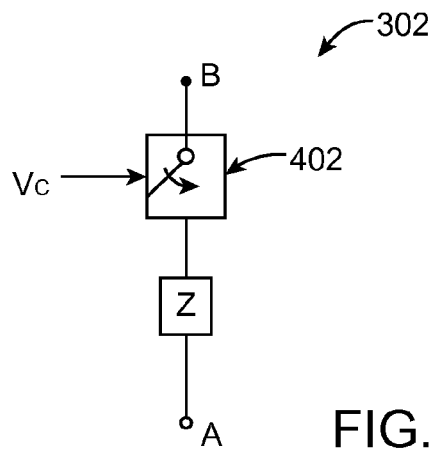
FIGS. 15 and 16 are circuit diagrams of illustrative switchable load circuits that may be used as the tunable element in the antenna tuning circuitry of FIG. 12 in accordance with an embodiment of the present invention.

In general, element 302 may be any switchable or tunable electrical component that can be adjusted in real time. FIG. 15 shows one suitable circuit implementation of tunable element 302. As shown in FIG. 15, element 302 may include a radio-frequency switch 402 and a load circuit Z coupled in series between terminals A and B. Switch 402 may be implemented using a p-i-n diode, a gallium arsenide field-effect transistor (FET), a microelectromechanical systems (MEMS) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 300 (FIG. 11). For example, a high Vc will turn on or close switch 402 whereas a low Vc will turn off or open switch 402.

Load circuit Z may be formed from one or more electrical components. Components that may be used as all or part of circuit Z include resistors, inductors, and capacitors. Desired resistances, inductances, and capacitances for circuit Z may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 16:
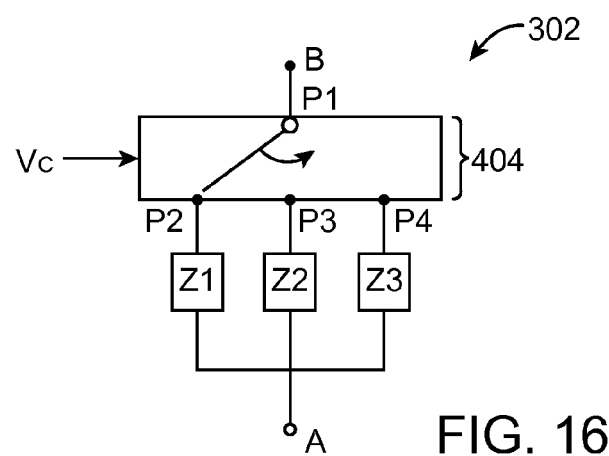
Figure 17:
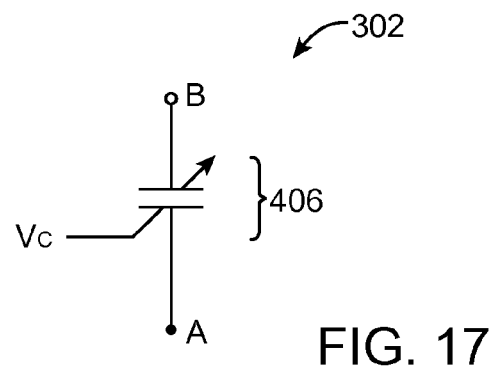
FIG. 17 is a circuit diagram of an illustrative variable capacitor circuit that may be used as the tunable element in the antenna tuning circuitry of FIG. 12 in accordance with an embodiment of the present invention.

In another suitable arrangement, tunable element 302 may include a switch 404 (e.g., a single-pole triple-throw radio-frequency switch) and multiple load circuits Z1, Z2, and Z3. As shown in FIG. 16, switch 404 may have ports P1, P2, P3, and P4. Terminal B of tunable element 302 may be coupled to port P1 while terminal A of tunable element 302 may be coupled to port P2 via circuit Z1, to port P3 via circuit Z2, and to port P4 via circuit Z3. As described previous, load circuits Z1, Z2, and Z3 may include any desired combination of resistive components, inductive components, and capacitive components formed using integrated circuits, discrete components, or other suitable conductive structures. Switch 404 may be controlled using signal Vc generated by control circuit 300. For example, switch 404 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 16 in which tunable element 302 includes three impedance loading circuits is merely illustrative and does not serve to limit the scope of the present invention. If desired, tunable element 302 may include a radio-frequency switch having any number of ports configured to support switching among any desired number of loading circuits.

In another suitable arrangement, tunable element 302 may include a variable capacitor circuit 406 (sometimes referred to as a varactor). As shown in FIG. 16, varactor may have first terminal A, second terminal B, and a control terminal operable to receive signal Vc from control circuit 300. Control circuit 300 may be adjusted so that Vc adjusts the capacitance of varactor 406 to the desired amount. Varactor 406 may be formed using integrated circuits, one or more discrete components (e.g., SMT components), etc. In general, varactor 406 may be continuously variable capacitors or semi-continuously adjustable capacitors.

Figure 18:
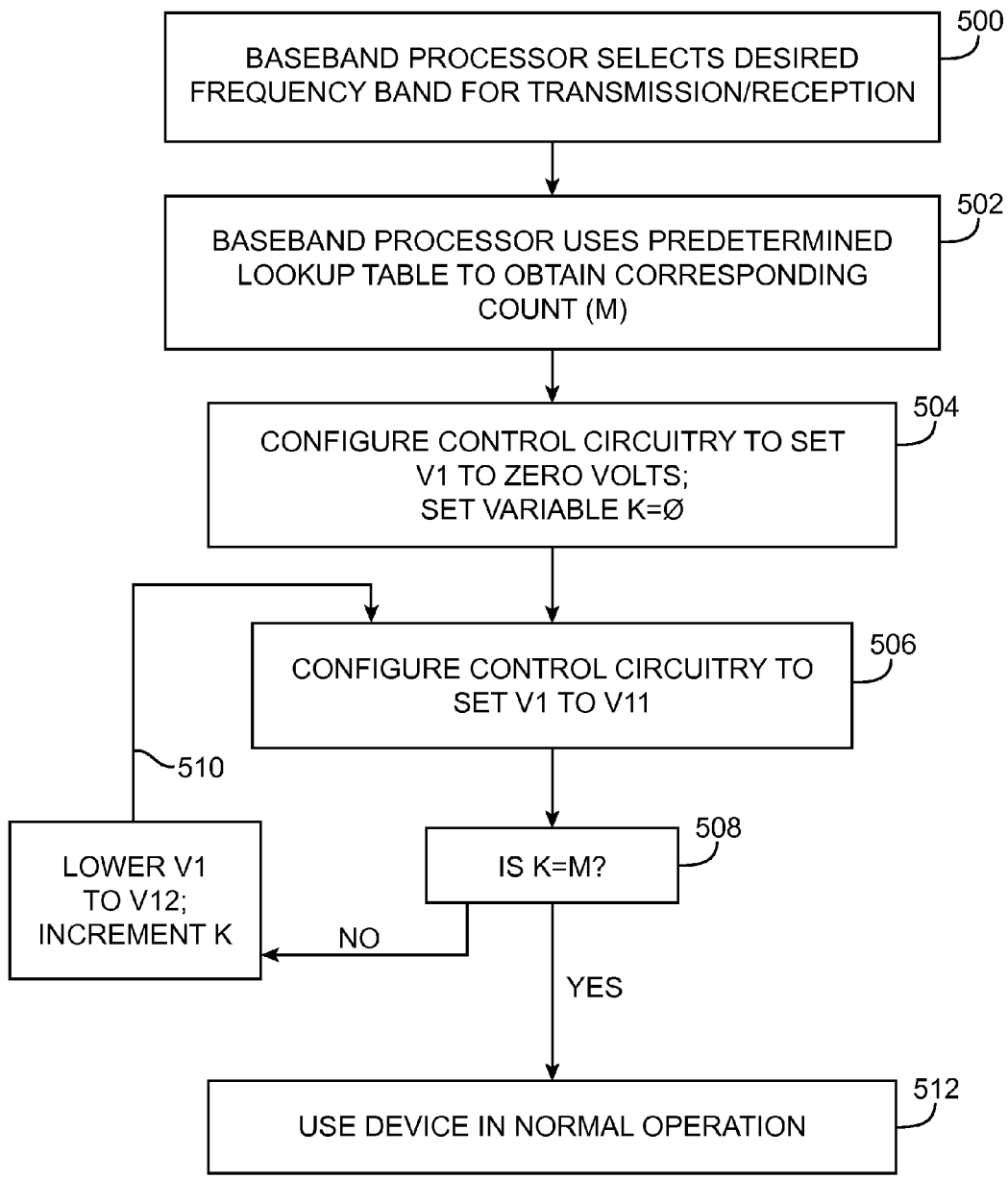
FIG. 18 is a flow chart of illustrative steps for using the antenna tuning circuitry of the type shown in connection with FIG. 12 to cover multiple communications bands of interest in accordance with an embodiment of the present invention.

FIG. 18 is a flow chart of illustrative steps for operating the antenna tuning circuitry of the type shown in connection with FIG. 12 to cover multiple communications bands of interest. At step 500, baseband processor 88 may select a desired frequency band for wireless transmission/reception. At step 502, baseband processor 88 may refer to a predetermined lookup table (e.g., precomputed lookup table 400 that is stored in circuitry 28) to obtain a count value (M) corresponding to the selected frequency band (i.e., the count value that counter 316 needs to exhibit so that tunable element 302 is properly tuned to support operation in the selected frequency band).

At step 504, control circuitry 28 may drive voltage signal V1 to zero volts and may set a temporary count variable K to zero. At step 506, control circuitry 28 may be configured to assert signal V1 to voltage level $V_{11}$ (see, e.g., time t0 in FIG. 13).

At step 508, storage and processing circuitry 28 may check whether K is equal to M. If K is not equal to M (i.e., if K is less than M), control circuitry 28 may temporarily lower signal V1 to voltage level $V_{12}$ and K may be incremented by one (e.g., see, e.g., a falling edge of signal V1 in FIG. 13). Processing may subsequently loop back to step 506, as indicated by path 510. If K is equal to M, the antenna tuning procedure is complete and device 10 may be placed in normal operation to transmit and receive radio-frequency signals in the desired frequency band(s).

In scenarios in which other operating frequency bands of interests are needed (e.g., when device 10 moves to another geographical region), device 10 may be automatically powered down and the steps of FIG. 18 may be repeated to selectively tune antennas 40 according to lookup table 400 so that device 10 can operate in the other frequency bands of interest.

The foregoing is merely illustrative of the principles of this invention and various modifications can be made by those skilled in the art without departing from the scope and spirit of the invention. The foregoing embodiments may be implemented individually or in any combination.

What is claimed is:
1. An electronic device comprising:
an antenna having an antenna resonating element, an antenna ground, a first antenna feed terminal coupled to the antenna resonating element, and a second antenna feed terminal coupled to the antenna ground;
a radio-frequency transceiver;
a radio-frequency transmission line having a signal path coupled between the radio-frequency transceiver and the first antenna feed terminal and having a ground path coupled between the radio-frequency transceiver circuitry and the second antenna feed terminal, wherein the radio-frequency transceiver is configured to transmit radio-frequency signals to the antenna resonating element over the signal path;
an adjustable antenna tuning circuit that is configured to adjust a resonant frequency of the antenna;
control circuitry that is configured to control the adjustable antenna tuning circuit by conveying a signal to the adjustable antenna tuning circuit over the signal path;
a first inductor coupled between the control circuitry and the signal path; and
a second inductor coupled between the control circuitry and the ground path.

2. The electronic device defined in claim 1 further comprising:
a capacitor coupled between the signal path and the antenna resonating element, wherein the capacitor is configured to convey the radio-frequency signals to the antenna resonating element; and
a third inductor coupled between the signal path and the adjustable antenna tuning circuit, wherein the third inductor is configured to convey the signal to the adjustable antenna tuning circuit.

3. The electronic device defined in claim 1, wherein the adjustable antenna tuning circuit comprises a voltage regulating circuit that is configured to receive the signal from the signal path and to generate corresponding first and second voltage signals based on the signal received from the signal path.

4. The electronic device defined in claim 3, wherein the adjustable antenna tuning circuit comprises a comparator circuit that is configured to receive the first and second voltage signals, to drive its output high when the first voltage signal exceeds the second voltage signal, and to drive its output low when the second voltage signal exceeds the first voltage signal.

5. The electronic device defined in claim 4, wherein the counter circuit has a control input coupled to the comparator, is configured to increment its count in response to detecting a transition at its control input, and is configured to output an additional signal that is proportional to the count associated with the counter circuit.

6. The electronic device defined in claim 1, wherein the adjustable antenna tuning circuit comprises radio-frequency switching circuitry.

7. The electronic device defined in claim 6, wherein the adjustable antenna tuning circuit further comprises a plurality of capacitive structures coupled to respective ports of the radio-frequency switching circuitry.

8. The electronic device defined in claim 6, wherein the adjustable antenna tuning circuit further comprises a plurality of inductive structures coupled to respective ports of the radio-frequency switching circuitry.

9. The electronic device defined in claim 1, wherein the adjustable antenna tuning circuit comprises a variable capacitor having a variable capacitance that is controlled at least partially by the signal.

10. The electronic device defined in claim 1 wherein the antenna comprises an antenna selected from the group consisting of: a loop antenna, an inverted-F antenna, a patch antenna, a slot antenna, a planar inverted-F antenna, and a helical antenna.

11. The electronic device defined in claim 1, wherein the signal comprises a power supply voltage.

12. The electronic device defined in claim 11, wherein the adjustable antenna tuning circuit comprises a tunable element having a first terminal that receives the power supply voltage, a second terminal that receives a control signal that places the tunable element into a selected one of a number of different operating states to adjust the resonant frequency of the antenna, and a third terminal coupled to ground, the tunable element being powered by the power supply voltage power received over the first terminal.

13. The electronic device defined in claim 1, wherein the signal comprises a direct current (DC) voltage.

14. The electronic device 1, wherein the signal comprises a time-varying voltage.

15. The electronic device defined in claim 1, further comprising:
   a third inductor coupled between the signal path and the adjustable antenna tuning circuit; and
   a capacitor coupled between the signal path and the antenna resonating element.

16. An electronic device comprising:
   an antenna having an antenna resonating element, an antenna ground, a first antenna feed terminal coupled to the antenna resonating element, and a second antenna feed terminal coupled to the antenna ground;
   a radio-frequency transceiver;
   a radio-frequency transmission line having a signal path coupled between the radio-frequency transceiver and the first antenna feed terminal and having a ground path coupled between the radio-frequency transceiver circuitry and the second antenna feed terminal, wherein the radio-frequency transceiver is configured to transmit radio-frequency signals to the antenna resonating element over the signal path;
   an adjustable antenna tuning circuit that is configured to adjust a resonant frequency of the antenna; and
   control circuitry that is configured to control the adjustable antenna tuning circuit by conveying a signal to the adjustable antenna tuning circuit over the signal path, wherein the antenna tuning circuit comprises:
      additional control circuitry that is configured to receive the signal and to generate a control signal based on the signal, and
      a tunable element that is configured to receive the control signal and to adjust the resonant frequency of the antenna based on the control signal.

17. The electronic device defined in claim 16, wherein the tunable element has a first terminal that is configured to receive the control signal and a second terminal that is configured to receive the signal from the signal path, the tunable element being powered by the signal received over the second terminal.

18. The electronic device defined in claim 17, wherein the tunable element comprises a switch having a silicon-on-insulator substrate.

19. The electronic device defined in claim 17, wherein the tunable element comprises a microelectromechanical systems (MEMs) switch.

20. Wireless communications circuitry comprising:
   an antenna having an antenna resonating element, an antenna ground, a first antenna feed terminal coupled to the antenna resonating element, and a second antenna feed terminal coupled to the antenna ground;
   a radio-frequency transceiver;
   a radio-frequency transmission line having a signal path coupled between the radio-frequency transceiver and the first antenna feed terminal and having a ground path coupled between the radio-frequency transceiver circuitry and the second antenna feed terminal, wherein the radio-frequency transceiver is configured to transmit radio-frequency signals to the antenna resonating element over the signal path;
   an adjustable antenna tuning circuit that is coupled to the antenna and that is configured to adjust a resonant frequency of the antenna; and
   control circuitry that is configured to control the adjustable antenna tuning circuit by conveying a signal to the adjustable antenna tuning circuit over the signal path, wherein the adjustable antenna tuning circuit comprises a voltage regulating circuit that is configured to receive the signal from the signal path and to generate corresponding first and second voltage signals based on the signal received from the signal path.

* * * * *